(12) United States Patent
Kessel et al.

(10) Patent No.: US 7,759,050 B2
(45) Date of Patent: Jul. 20, 2010

(54) METHOD FOR MANUFACTURING THIN SUBSTRATE USING A LAMINATE BODY

(75) Inventors: Carl R. Kessel, St. Paul, MN (US); Larry D. Boardman, Woodbury, MN (US); Richard J. Webb, Inver Grove Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/336,994

(22) Filed: Dec. 17, 2008

(65) Prior Publication Data

US 2009/0115075 A1 May 7, 2009

Related U.S. Application Data

(62) Division of application No. 11/457,567, filed on Jul. 14, 2006.

(51) Int. Cl.
*G03F 7/11* (2006.01)

(52) U.S. Cl. .................... 430/319; 430/273.1; 430/323; 430/327; 430/330

(58) Field of Classification Search .............. 430/270.1, 430/271.1, 272.1, 287.1, 311, 273.1, 319
See application file for complete search history.

(56) References Cited

U.S. PATENT DOCUMENTS

| 2,843,555 | A | 7/1958 | Berridge |
|---|---|---|---|
| 3,159,662 | A | 12/1964 | Ashby |
| 3,178,464 | A | 4/1965 | Pierpoint |
| 3,220,972 | A | 11/1965 | Lamoreaux |
| 3,313,773 | A | 4/1967 | Lamoreaux |
| 3,410,886 | A | 11/1968 | Joy |
| 3,470,225 | A | 9/1969 | Knorre et al |
| 3,567,755 | A | 3/1971 | Seyfried et al |
| 3,715,334 | A | 2/1973 | Karstedt |
| 3,775,452 | A | 11/1973 | Karstedt |
| 3,814,730 | A | 6/1974 | Karstedt |
| 3,814,731 | A | 6/1974 | Nitzsche et al |
| 4,276,252 | A | 6/1981 | Kreis et al. |
| 4,288,345 | A | 9/1981 | Ashby et al. |
| 4,313,988 | A | 2/1982 | Koshar et al. |
| 4,394,414 | A | 7/1983 | Brown et al. |
| 4,510,094 | A | 4/1985 | Drahnak |
| 4,530,879 | A | 7/1985 | Drahnak |
| 4,603,215 | A | 7/1986 | Chandra et al. |
| 4,640,939 | A | 2/1987 | Cavezzan et al. |
| 4,670,531 | A | 6/1987 | Eckberg |
| 4,677,137 | A | 6/1987 | Bany et al. |
| 4,699,813 | A | 10/1987 | Cavezzan |
| 4,705,765 | A | 11/1987 | Lewis |
| 4,712,092 | A | 12/1987 | Boldridge, Jr. et al. |
| 4,916,169 | A | 4/1990 | Boardman et al. |
| 5,089,536 | A | 2/1992 | Palazzotto |
| 5,091,483 | A | 2/1992 | Mazurek et al. |
| 5,286,815 | A | 2/1994 | Leir et al. |
| 5,409,773 | A | 4/1995 | Kessel et al. |
| 5,414,297 | A | 5/1995 | Morita et al. |
| 5,476,566 | A | 12/1995 | Cavasin |
| 5,596,025 | A | 1/1997 | Oxman et al. |
| 5,604,038 | A | 2/1997 | Denes et al. |
| 5,872,046 | A * | 2/1999 | Kaeriyama et al. .......... 438/465 |
| 5,958,794 | A | 9/1999 | Bruxvoort et al. |
| 5,994,204 | A * | 11/1999 | Young et al. ................. 438/455 |
| 6,062,133 | A | 5/2000 | Blalock |
| 6,194,317 | B1 | 2/2001 | Kaisaki et al. |
| 6,204,350 | B1 | 3/2001 | Liu et al. |
| 6,235,141 | B1 | 5/2001 | Feldman et al. |
| 6,376,569 | B1 | 4/2002 | Oxman et al. |
| 6,447,884 | B1 | 9/2002 | Burberry et al. |
| 6,551,906 | B2 | 4/2003 | Oka |
| 6,620,649 | B2 | 9/2003 | Uchida |
| 6,786,810 | B2 | 9/2004 | Muilenburg et al. |
| 6,792,991 | B2 | 9/2004 | Thallner |
| 6,939,741 | B2 | 9/2005 | Fukuoka et al. |
| 7,201,969 | B2 | 4/2007 | Miyakawa et al. |
| 7,226,812 | B2 | 6/2007 | Lu et al. |
| 2002/0028409 | A1 * | 3/2002 | Yasunami et al. ......... 430/272.1 |

(Continued)

FOREIGN PATENT DOCUMENTS

| EP | 0 238 033 | 9/1997 |
|---|---|---|
| JP | 6-302569 | 10/1994 |
| JP | 11-283279 | 10/1999 |
| JP | 2003/200436 | 7/2003 |
| WO | WO 98/12075 | 3/1998 |
| WO | WO 2004/006296 | 1/2004 |
| WO | WO 2005/057651 | 6/2005 |

OTHER PUBLICATIONS

Clarson, S. J., Siloxane Polymers, Prentice Hall: Englewood Cliffs, N. J., (1993).

(Continued)

*Primary Examiner*—Cynthia H Kelly
*Assistant Examiner*—Anca Eoff
(74) *Attorney, Agent, or Firm*—Stephen F. Wolf

(57) ABSTRACT

Provided is a laminated body comprising a substrate to be ground and a support, where the substrate may be ground to a very small (thin) thickness and can then be separated from the support without damaging the substrate. One embodiment is a laminated body comprising a substrate to be ground, a curable silicone adhesive layer in contact with the substrate to be ground, a photothermal conversion layer comprising a light absorbing agent and a heat decomposable resin, and a light transmitting support. After grinding the substrate surface which is opposite that in contact with the adhesive layer, the laminated body is irradiated through the light transmitting layer and the photothermal conversion layer decomposes to separate the substrate and the light transmitting support.

16 Claims, 5 Drawing Sheets

U.S. PATENT DOCUMENTS

| | | |
|---|---|---|
| 2002/0062919 A1 | 5/2002 | Oxman et al. |
| 2004/0213994 A1 | 10/2004 | Kozakai et al. |
| 2004/0265599 A1 | 12/2004 | Ushio et al. |
| 2005/0016464 A1 | 1/2005 | Duggal et al. |
| 2005/0085050 A1 | 4/2005 | Draney et al. |
| 2005/0170612 A1 | 8/2005 | Miyanari et al. |
| 2005/0233547 A1 | 10/2005 | Noda et al. |
| 2006/0040113 A1 | 2/2006 | Deruelle et al. |

OTHER PUBLICATIONS

Crivello, J. V., et al.,"Cationic Photopolymerization of Ambifunctional Monomers", *Macromolekular Symposia*, vol. 95, pp. 79-89, (1995).

*Encyclopedia of Polymer Science and Engineering*, 2nd Edition, vol. 15, p. 252, (1989).

Jacobine, A.F., et al., "Photopolymerizable Silicone Monomers, Oligomers, and Resins" in Radiation Curing Science and Technology, Plenum: New York, pp. 200-214, (1992).

Kirk-Othmer Encyclopedia of Polymer Science and Engineering, $2^{nd}$ edition, Wiley-Interscience Pub., vol. 15, pp. 235-243, (1989).

Kirk-Othmer Encyclopedia of Chemical Technology, 4th edition, Wiley-Interscience Pub., vol. 22, pp. 94-98, (1997).

Noll, W., Chemistry and Technology of Silicones, Verlag Chemie: Weinheim, (1960).

Plueddemann, E. P. et al., "Epoxyorganosiloxanes", *J. Am. Chem. Soc.*, vol. 81, pp. 2632-2635, (1959).

Stark, F. O., et al., "Comprehensive Organometallic Chemistry", Ed. Geoffrey Wilkinson, vol. 2, Chapter 9.3, pp. 329-330, Pergamon Press: New York, (1982).

Tomanek, A. et al., Silicones and Industry: A Compendium for Practical Use, Instruction, and Reference, Wacher-Chemie: Munich, (1993).

\* cited by examiner

METHOD FOR MANUFACTURING THIN SUBSTRATE USING A LAMINATE BODY

CROSS REFERENCE TO RELATED APPLICATIONS

This application is a divisional of U.S. Ser. No. 11/457,567, filed Jul. 14, 2006, now pending, the disclosure of which is incorporated by reference in its entirety herein.

FIELD

The present invention relates to a laminated body where a substrate to be ground, such as silicon wafer, fixed on a support can be easily separated from the support, and also relates to a method for manufacturing this laminated body and a method for producing a thinned substrate

BACKGROUND

In various fields, reducing the thickness of a substrate often is critical. For example, in the field of quartz devices, reducing the thickness of a quartz wafer is desired so as to increase the oscillation frequency. Particularly, in the semiconductor industry, efforts to further reduce the thickness of a semiconductor wafer are in progress to respond to the goal of reducing the thickness of semiconductor packages as well as for high-density fabrication by chip lamination technology. Thickness reduction is performed by so-called back side grinding of a semiconductor wafer on the surface opposite that containing pattern-formed circuitry. Usually, in conventional techniques of grinding the back side, or surface, of a wafer and conveying it while holding the wafer with only a backgrinding protective tape, thickness reduction can be accomplished in practice only to a thickness of about 150 micrometers (µm) because of problems such as uneven thickness of the ground wafer or warping of the wafer with protective tape after grinding. For example, Japanese Unexamined Patent Publication (Kokai) No. 6-302569 discloses a method where a wafer is held on a ring-form frame through a pressure-sensitive adhesive tape, the back surface of this wafer held on the frame is ground and the wafer is conveyed to the next step. However, this method has not yet attained a remarkable improvement over the present level of wafer thickness that may be obtained without encountering the aforementioned problems of unevenness or warping.

A method of grinding the back surface of a wafer and conveying it while firmly fixing the wafer on a hard support through an adhesive agent has also been proposed. This intends to prevent the breakage of a wafer during the back surface grinding and conveyance by supporting the wafer using such a support. According to this method, a wafer can be processed to a lower thickness level as compared with the above-described method, however, the thin wafer cannot be separated from the support without breaking the wafer and therefore, this method cannot be practically used as a method of thinning a semiconductor wafer.

SUMMARY

The present invention provides a laminated body in which a substrate to be ground is fixed on a support, by means of a joining layer (comprising a cured silicone adhesive), and the joining layer can be easily peeled off from the substrate after grinding. The present invention further provides a method for manufacturing the laminated body, and a method for manufacturing a thin substrate using the laminated body. In some preferred embodiments, the thin substrate may comprise a semiconductor wafer.

The present method allows the laminated body to be subjected to higher temperature processes than prior art methods. In the manufacture of semiconductor wafers, the instant method allows subsequent processing such as sputtering or dry etching, and still allows the joining layer to be easily removed from the ground substrate (wafer). In some embodiments the laminated body comprising a cured silicone adhesive joining layer may be subjected to temperatures in excess of 150° C., preferably 200° C., and more preferably 250° C.

The curable silicone adhesive may be a condensation-curable silicone adhesive, addition-curable (hydrosilylation curable) silicone adhesive, a free radical-cure silicone adhesive, or a cationic-curable silicone adhesive. As used herein, a "curable" silicone refers to one that is capable of polymerization and/or crosslinking reactions including, for example, photopolymerization reactions involving one or more compounds capable of curing. Preferably the cure mechanism yields no gaseous or liquid byproducts that could contaminate or damage the laminated body. Preferably, the cure mechanism does not use agents, such as acidic agents, that may compromise the functioning of the semiconductor.

In one embodiment of the present invention, a laminated body is provided, the laminated body comprising a substrate to be ground; a joining layer (comprising a cured silicone adhesive) in contact with said substrate to be ground; a photothermal conversion layer (comprising a light absorbing agent and a heat decomposable resin); and a light transmitting support. After grinding the substrate surface that is opposite that in contact with the joining layer, the laminated body can be irradiated through the light-transmitting layer to decompose the photothermal conversion layer and to separate the substrate and the light transmitting support. In this laminate, the substrate ground to a very small thickness can be separated from the support without breaking the substrate.

A method for manufacturing the above-described laminated body is also provided, the method comprising providing a photothermal conversion layer on a light transmitting support, applying a curable silicone adhesive to a substrate to be ground or to the photothermal conversion layer, joining the substrate to be ground and the photothermal conversion layer by means of the curable silicone adhesive, under reduced pressure, curing the silicone adhesive to form a joining and therefore form a laminated body. The photothermal conversion layer may be provided by providing a photothermal conversion layer precursor containing a light absorbing agent and a heat decomposable resin solution, or a monomer or oligomer as a precursor material of a heat decomposable resin; and drying to solidify or cure the photothermal conversion layer precursor to form a photothermal conversion layer on the light transmitting support.

By joining the substrate to be ground and the light transmitting support through the joining layer (comprising a cured silicone adhesive) under reduced pressure, bubbles and dust contamination are prevented from forming inside the laminated body, so that a level surface can be formed and the substrate can maintain the evenness of thickness after grinding.

In still another embodiment of the present invention, a method for manufacturing a reduced thickness substrate is provided, the method comprising preparing the above-described laminated body, grinding the substrate to a desired thickness, irradiating the photothermal conversion layer through the light transmitting support to decompose the photothermal conversion layer and thereby to separate the substrate from the light transmitting support after grinding, and peeling the joining layer from the substrate after grinding. In this method, a substrate can be ground to a desired thickness (for example, 150 µm or less, preferably 50 µm or less, more preferably 25 µm or less) on a support and after grinding, the support is separated from the substrate using exposure to radiation energy, so that the joining layer remaining on the substrate after grinding can be easily peeled off from the substrate.

DETAILED DESCRIPTION

Figure 1:
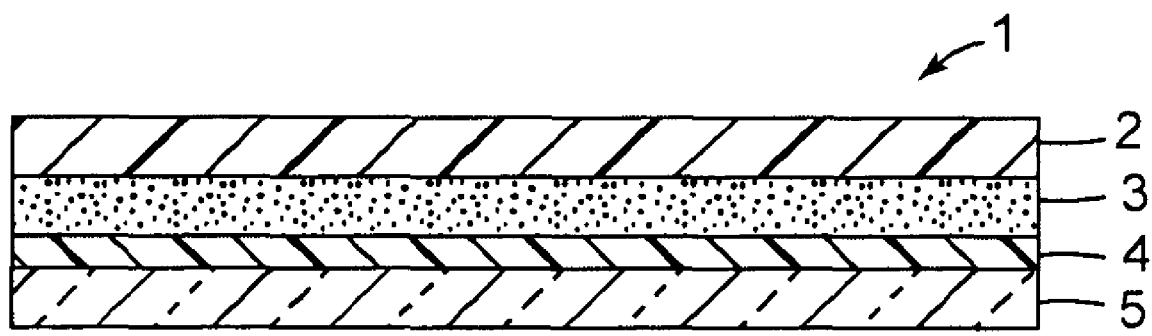
FIG. 1 is a cross-sectional view showing a laminated body of the present invention.

The laminated body features a cured silicone adhesive joining layer for joining the substrate to be ground to a support. In the laminated body 1 of FIG. 1, a substrate 2 to be ground, a joining layer 3 (comprising a cured silicone adhesive), a photothermal conversion layer 4 and a support 5 are shown. The elements comprising the laminated body of the present invention are described in greater detail below.

The joining layer, comprising a cured silicone adhesive, is used for fixing the substrate to be ground to the support through a photothermal conversion layer. After the separation of the substrate and the support by the decomposition of the photothermal conversion layer, a substrate having the joining layer thereon is obtained. Therefore, the joining layer is desirably easily separated from the substrate, such as by peeling. Thus, the joining layer has an adhesive strength high enough to fix the substrate to the support yet low enough to permit separation from the substrate.

The adhesive layer comprises a curable silicone adhesive selected from a condensation curable silicone adhesive, an addition-curable (or hydrosilylation curable) silicone adhesive, a free radical-cure silicone adhesive, or a cationic-curable silicone adhesive. Curable silicone adhesives can provide long-term durability and are useful over a wide range of temperature, humidity and environmental conditions, and can be used effectively to bond the laminated body of the invention. In some embodiments, the curable silicones may be photocurable silicones, including UV and visible light curable silicones. In some embodiments, the curable silicone may further comprise a reinforcing agent such as a silica, quartz, and/or MQ resin, which reinforces the cured silicone. Such a reinforcing agent may be added in amounts up to 75 wt. % of the curable silicone composition.

General references regarding curable silicone polymers include Kirk-Othmer Encyclopedia of Polymer Science and Engineering, $2^{nd}$ edition, Wiley-Interscience Pub., 1989, volume 15, pp. 235-243; Comprehensive Organometallic Chemistry, Ed. Geoffrey Wilkinson, Vol. 2, Chapter 9.3, F. O, Stark, J. R. Falender, A. P. Wright, pp. 329-330, Pergamon Press: New York, 1982; Silicones and Industry: A Compendium for Practical Use, Instruction, and Reference, A. Tomanek, Carl Hanser: Wacher-Chemie: Munich, 1993; Siloxane Polymers, S. J. Clarson, Prentice Hall: Englewood Cliffs, N.J., 1993; and Chemistry and Technology of Silicones, W. Noll, Verlag Chemie: Weinheim, 1960.

The curable silicone adhesive can an addition-cure or hydrosilylation cure silicone adhesive comprising an ethylenically unsaturated (e.g. alkenyl or (meth)acryloyl) functional silicone base polymer, a hydride functional cross-linking or chain extending agent (e.g., SiH), and a hydrosilylation catalyst. The silicone base polymer has ethylenically unsaturated (e.g., vinyl, propenyl, higher alkenyl, (meth)acryloyl, etc.) groups which may be present at the ends of the polymer (terminal) and/or pendent along the polymer chain. Preferably the ethylenically unsaturated groups are vinyl or higher alkenyl groups. It may be desirable for a reinforcing agent to be included such as, for example, a silica, quartz, and/or MQ resin containing alkenyl or SiH functional groups. The hydrosilylation catalyst may be a Group VIII metal or metal complex or supported metal catalyst, but is typically a noble metal catalyst containing, for example, Pt or Rh.

Addition-cured silicones (e.g., hydrosilylation cured silicones) are generally considered to be of higher quality and are more dimensionally stable than condensation-cured silicones. Unlike condensation-cured silicones, addition-cured silicones, e.g., hydrosilylation-cured silicones, do not produce potentially detrimental byproducts during curing. Such silicones differ from condensation-cured silicones in that the hydrosilylation-cured composition typically contains 1) a polyethylenically unsaturated silicone polymer or oligomer; 2) a "hydrosilane" component containing two or more silane (Si—H) bonds; and 3) a hydrosilylation catalyst such as a platinum catalyst. By "polyethylenically unsaturated" it is meant a compound or component having a plurality of ethylenically unsaturated groups, such as a plurality of vinyl groups and (meth)acryloyl groups. The ethylenically unsaturated groups and the Si—H groups may be terminal or pendent. In some embodiments, the silicone may have both Si—H bonds and vinyl groups.

A particularly preferred addition-cured silicone is formed by reacting (1) a multiply-ethylenically unsaturated group-containing organopolysiloxane with (2) an organopolysiloxane containing a multiplicity of SiH bonds per molecule (hereinafter "organohydropolysiloxane"). This reaction is typically facilitated by the presence of (3) a platinum-containing catalyst.

The curable silicone composition can be prepared by combining (e.g., mixing together) the polyethylenically unsaturated organopolysiloxane, the organohydropolysiloxane, and the hydrosilylation catalyst. In one embodiment, the components are pre-mixed into preferably two parts prior to use. For example, part "A" may contain the vinyl-containing organopolysiloxane, and the catalyst, while part "B" may contain the organohydropolysiloxane and optionally vinyl-containing organopolysiloxane. In another embodiment, the components are provided in one part and further contain an ingredient (e.g., a catalyst inhibitor) that inhibits the cure reaction.

Numerous patents teach the use of various complexes of cobalt, rhodium, nickel, palladium, or platinum as catalysts for accelerating the thermally-activated addition reaction (hydrosilylation) between a compound containing silicon-bonded hydrogen and a compound containing aliphatic unsaturation. For example, U.S. Pat. No. 4,288,345 (Ashby et al.)

discloses as a catalyst for hydrosilylation reactions a platinum-siloxane complex. Additional platinum-siloxane complexes are disclosed as catalysts for hydrosilylation reactions in U.S. Pat. Nos. 3,715,334, 3,775,452, and 3,814,730 (Karstedt et al.). U.S. Pat. No. 3,470,225 (Knorre et al.) discloses production of organic silicon compounds by addition of a compound containing silicon-bonded hydrogen to organic compounds containing at least one non-aromatic double or triple carbon-to-carbon bond using a platinum compound of the empirical formula $PtX_2(RCOCR'COR'')_2$ wherein X is halogen, R is alkyl, R' is hydrogen or alkyl, and R" is alkyl or alkoxy. The catalysts disclosed in the foregoing patents are characterized by their high catalytic activity. Other platinum complexes for accelerating the aforementioned thermally-activated addition reaction include: a platinacyclobutane complex having the formula $(PtCl_2C_3H_6)_2$ (U.S. Pat. No. 3,159,662, Ashby); a complex of a platinous salt and an olefin (U.S. Pat. No. 3,178,464, Pierpoint); a platinum-containing complex prepared by reacting chloroplatinic acid with an alcohol, ether, aldehyde, or mixtures thereof (U.S. Pat. No. 3,220,972, Lamoreaux); a platinum compound selected from trimethylplatinum iodide and hexamethyldiplatinum (U.S. Pat. No. 3,313,773, Lamoreaux); a hydrocarbyl or halohydrocarbyl nitrile-platinum (II) halide complex (U.S. Pat. No. 3,410,886, Joy); a hexamethyl-dipyridine-diplatinum iodide (U.S. Pat. No. 3,567,755, Seyfried et al.); a platinum curing catalyst obtained from the reaction of chloroplatinic acid and a ketone having up to 15 carbon atoms (U.S. Pat. No. 3,814,731, Nitzsche et al.); a platinum compound having the general formula $(R')PtX_2$ where R' is a cyclic hydrocarbon radical or substituted cyclic hydrocarbon radical having two aliphatic carbon-carbon double bonds, and X is a halogen or alkyl radical (U.S. Pat. No. 4,276,252, Kreis et al.); platinum alkyne complexes (U.S. Pat. No. 4,603,215, Chandra et al.); platinum alkenylcyclohexene complexes (U.S. Pat. No. 4,699,813, Cavezzan); and a colloidal hydrosilylation catalyst provided by the reaction between a silicon hydride or a siloxane hydride and a platinum (0) or platinum (II) complex (U.S. Pat. No. 4,705,765, Lewis).

Although these platinum complexes and many others are useful as catalysts in processes for accelerating the thermally-activated addition reaction between the compounds containing silicon-bonded hydrogen and compounds containing aliphatic unsaturation, processes for promoting the ultraviolet or visible radiation-activated addition reaction between these compounds may be preferable in some instances. Platinum complexes that can be used to initiate ultraviolet radiation-activated hydrosilation reactions have been disclosed, e.g., platinum azo complexes (U.S. Pat. No. 4,670,531, Eckberg); ($\eta^4$-cyclooctadiene)diarylplatinum complexes (U.S. Pat. No. 4,530,879, Drahnak); and ($\eta^5$-cyclopentadienyl)trialkylplatinum complexes (U.S. Pat. No. 4,510,094, Drahnak). Other compositions that are curable by ultraviolet radiation include those described in U.S. Pat. Nos. 4,640,939 and 4,712,092 and in European Patent Application No. 0238033. U.S. Pat. No. 4,916,169 (Boardman et al.) describes hydrosilylation reactions activated by visible radiation. U.S. Pat. No. 6,376,569 (Oxman et al.) describes a process for the actinic radiation-activated addition reaction of a compound containing silicon-bonded hydrogen with a compound containing aliphatic unsaturation, said addition being referred to as hydrosilylation, the improvement comprising using, as a platinum hydrosilylation catalyst, an ($\eta^5$-cyclopentadienyl) tri($\sigma$-aliphatic)platinum complex, and, as a reaction accelerator, a free-radical photoinitiator capable of absorbing actinic radiation, i.e., light having a wavelength ranging from about 200 nm to about 800 nm. The process can also employ, as a sensitizer, a compound that absorbs actinic radiation, and that is capable of transferring energy to the aforementioned platinum complex or platinum complex/free-radical photoinitiator combination, such that the hydrosilylation reaction is initiated upon exposure to actinic radiation. The process is applicable both to the synthesis of low molecular weight compounds and to the curing of high molecular weight compounds, i.e., polymers.

Sometimes it is useful to include in the composition additives to improve the bath life or working time of the hydrosilylation curable composition. Such hydrosilylation inhibitors are well known in the art and include such compounds as acetylenic alcohols, certain polyolefinic siloxanes, pyridine, acrylonitrile, organic phosphines and phosphites, unsaturated amides, and alkyl maleates. For example, an acetylenic alcohol compound can inhibit certain platinum catalysts and prevent curing from occurring at low temperatures. Upon heating, the composition begins to cure. The amount of catalyst inhibitor can vary up to about 10 times or more of the amount of catalyst, depending upon the activity of the catalyst and the shelf life desired for the composition.

The curable silicone adhesive can be at least one free radical-cure silicone adhesive comprising a polysiloxane polymer or oligomer having free-radically polymerizable, ethylenically unsaturated groups such as vinyl, allyl, (meth) acryloyl, etc. pendent from the polymer chain and/or the terminal ends. It is desirable for a free radical catalyst to be included for initiating free radical polymerization when the adhesive is to be thermally or radiation (e.g., UV or photo) cured. Optionally, a small percentage of a free radically polymerizable vinyl monomer can be included. In addition, a free radically polymerizable cross-linking agent may also be included.

Ethylenically unsaturated free radically polymerizable silicones, including especially the acrylated polysiloxane oligomers and polymers containing terminal and/or pendant ethylenically unsaturated groups, such as acrylate or methacrylate groups, can be prepared by a variety of methods, generally through the reaction of chloro-, silanol-, aminoalkyl-, epoxyalkyl-, hydroxyalkyl-, vinyl-, or silicon hydride-functional polysiloxanes with a corresponding (meth)acryloyl-functional capping agent. These preparations are reviewed in a chapter entitled "Photopolymerizable Silicone Monomers, Oligomers, and Resins" by A. F. Jacobine and S. T. Nakos in Radiation Curing Science and Technology (1992), Plenum: New York, pp. 200-214. Preferred acrylated polysiloxane oligomers include those acryl-modified polydimethylsiloxane resins commercially available from Goldschmidt under the TEGO RC designation and those acrylamido-terminated monofunctional and difunctional polysiloxanes described in U.S. Pat. No. 5,091,483 (Mazurek et al.).

The curable silicone adhesive can be at least one condensation-cure silicone adhesive. Condensation-curable silicones usually comprise pendent or terminal groups such as, for example, hydroxysilane (i.e., silanol), alkoxysilane or acyloxysilane functional groups that react in the presence of moisture to form cured (i.e., crosslinked) materials. Condensation-curable compositions comprising alkoxysilane or acyloxysilane functionality typically cure in two reactions. In the first reaction, the alkoxysilane or acyloxysilane groups hydrolyze in the presence of moisture and a catalyst to form compounds having silanol groups. In the second reaction, the silanol groups condense with other silanol, alkoxysilane, or acyloxysilane groups in the presence of a catalyst to form —Si—O—Si— linkages. The two reactions occur essentially simultaneously upon generation of the silanol-functional compound. Commonly used catalysts for the two reactions include Bronsted and Lewis acids and are described in the *Encyclopedia of Polymer Science and Engineering*, 2nd Edition, Volume 15, page 252, (1989). A single material may catalyze both reactions.

A variety of approaches have been used for providing condensation-curable compositions that have acceptable cure rates without processing and storage difficulties. For example, U.S. Pat. No. 2,843,555 describes a two-part system, one part comprising a functional polymer and the other part comprising a catalyst with the two parts being mixed just prior before use. U.S. Pat. No. 5,286,815 discloses an ammonium salt catalyst that is inactive until heated sufficiently to liberate an acid compound that initiates the moisture curing reaction. Alternatively, the condensation-curing agent can be a multifunctional cross-linking agent (e.g., an aminosilane) that serves as both catalyst and cross-linker.

U.S. Pat. No. 6,204,350 (Liu et al.), incorporated herein by reference, describes cure-on-demand, moisture-curable compositions of one or more compounds comprising molecules having reactive silane functional groups and an acid generating material are taught therein. The acid generating material releases an acid upon exposure to heat, ultraviolet light, visible light, electron beam irradiation or microwave irradiation to initiate and accelerate the crosslinking reaction.

The curable silicone adhesive can be at least one cationic-cure silicone adhesive. Cationic-curable silicones usually comprise pendent or terminal groups such as, for example, epoxy, alkenyl ether, oxetane dioxolane, and/or carbonate functional groups that react in the presence of a cationic catalyst to form cured (i.e., crosslinked) materials. If desired, the cationic curable silicone may further comprise a MQ resin to improve the strength of the cured silicone (joining layer).

The epoxysilicones may be prepared by many methods known in the art such as the chloroplatinic acid catalyzed addition reaction of hydride functional silicones with aliphatically unsaturated epoxy compounds, or the epoxidation of vinyl or like unsaturated siloxanes and Grignard type reactions as for example described by E. P. Plueddemann and G. Fanger, J. Am. Chem. Soc. 81, 2632-35 (1959). A convenient method is the hydrosiloxane addition reaction of unsaturated aliphatic epoxy compounds with hydride-functional silicone oligomers. When this method is used, it is preferred that essentially complete reaction of the SiH sites are accomplished although small amounts of hydrogen attached to silicon can be present. It is also preferred for best results that the epoxysilicone is essentially free from low molecular weight components such as cyclic siloxanes, since their presence in the final cured coating could adversely affect the adhesion property of the adhesive (resulting in adhesive loss or buildup).

U.S. Pat. No. 5,409,773 (Kessel et al.) describes one or more epoxysilicones having cycloaliphatic and non-cycloaliphatic epoxy groups in a total number which is about 5 to 50% of the total number of siloxane units, the ratio of the total number of cycloaliphatic epoxy groups to the total number of non-cycloaliphatic epoxy groups being from about 1:10 to 2:1, the epoxypolysiloxane(s) being cured in the presence of a catalytically effective amount of a cationic epoxy curing catalyst.

An article entitled "Cationic Photopolymerization of Ambifunctional Monomers" (J. V. Crivello et al., *Macromolekular Symposia*, 95, 79-89, (1995)) describes the photopolymerization of "ambifunctional" monomers (i.e., monomers bearing two chemically different reactive functional groups within the same molecule) using cationic catalysts. In one example, an ambifunctional monomer having both epoxycyclohexyl and trimethoxysilyl reactive functional groups is prepared and then subsequently UV irradiated in the presence of a cationic triarylsulfonium catalyst.

The cured silicone is conveniently obtained by mixing the cationic curable silicone and catalyst and optionally the epoxy-terminated silane in a solvent, coating the solution on the substrate and heating at a suitable curing temperature depending on the effectiveness of the catalyst and heat sensitivity of the substrate. Alternatively, the cationic curable silicone may be cured by means of a photoacid generator, which generates one or more molecules of a Bronsted or Lewis acid on exposure to UV or visible light, and without the application of heat. Mixtures of the epoxypolysiloxanes or mixtures of the epoxysilanes may be used.

Curing of the cationic curable silicone can be effected by mixing with conventional cationic epoxy curing catalysts activated by actinic radiation and/or heat. Catalysts activated by actinic radiation are preferred. Examples of suitable photoinitiators are onium salts of a complex halogen acid, particularly the polyaromatic iodonium and sulfonium complex salts having $SbF_6$, $SbF_5OH$, $PF_6$, $BF_4$, or $AsF_6$ anions, as are disclosed in U.S. Pat. No. 4,101,513, incorporated herein by reference. Preferred photoinitiators are the iodonium and sulfonium salts most preferably having the $SbF_6$ anion. Also useful photoinitiators are organometallic complex salts that are disclosed in U.S. Pat. No. 5,089,536, and supported photoinitiators for the actinic radiation activated polymerization of cationically-polymerizable compounds described in U.S. Pat. No. 4,677,137, both of which are incorporated herein by reference. Suitable heat-activated cationic catalysts which may be used include the heat-activated sulfonic and sulfonylic catalysts described in U.S. Pat. No. 4,313,988, incorporated herein by reference.

The substrate to be ground, such as a silicon wafer, generally has asperities such as circuit patterns on one side. For the joining layer to fill in the asperities of the substrate to be ground and rendering the thickness of the joining layer uniform, the silicone adhesive used for the joining layer is preferably in a liquid state during coating and laminating and preferably has a viscosity of less than 10,000 centipoise (cps) at the temperature (for example, 25° C.) of the coating and laminating operations. This liquid silicone adhesive is preferably coated by a spin coating method among various methods known in the art. As such an adhesive, a UV-curable or a visible light-curable silicone adhesive are particularly preferred, because the thickness of the joining layer can be made uniform and moreover, the processing speed is high.

The thickness of the joining layer is not particularly limited as long as it can ensure the thickness uniformity required for the grinding of the substrate to be ground and the tear strength necessary for the peeling of the joining layer from the wafer after removing the support from the laminated body, and can sufficiently absorb the asperities on the substrate surface. The thickness of the joining layer is typically from about 10 to about 150 μm, preferably from about 25 to about 100 μm. If desired, the substrate may be partially sawn through on the face adjacent the joining layer (circuit face), prior to assembling the laminated body.

The substrate may be, for example, a brittle material difficult to thin by conventional methods. Examples thereof include semiconductor wafers such as silicon and gallium arsenide, a rock crystal wafer, sapphire and glass.

The light transmitting support is a material capable of transmitting radiation energy, such as a laser beam used in the present invention, and the material is required to keep the ground body in a flat state and not cause it to break during grinding and conveyance. The light transmittance of the support is not limited as long as it does not prevent the transmittance of a practical intensity level of radiation energy into the photothermal conversion layer to enable the decomposition of the photothermal conversion layer. However, the transmittance is preferably, for example, 50% or more. Also, in order to prevent the ground body from warping during grinding, the light transmitting support preferably has a sufficiently high stiffness and the flexural rigidity of the support is preferably $2 \times 10^{-3}$ (Pa·m$^3$) or more, more preferably $3 \times 10^{-2}$ (Pa·m$^3$) or more. Examples of useful supports include glass plates and acrylic plates. Furthermore, in order to enhance the adhesive strength to an adjacent layer such as photothermal conversion layer, the support may be surface-treated with a silane coupling agent or the like, if desired. In the case of using a UV-curable photothermal conversion layer or joining layer, the support preferably transmits ultraviolet radiation.

The support is sometimes exposed to heat generated in the photothermal conversion layer when the photothermal conversion layer is irradiated or when a high temperature is produced due to frictional heating during grinding. Also, for the purpose of forming a metal film on the substrate a process such as vapor deposition, plating or etching may be additionally provided before separating the ground substrate from the support. Particularly, in the case of a silicon wafer, the support is sometimes subjected to a high-temperature process to form an oxide film. Accordingly, a support having heat resistance, chemical resistance and a low expansion coefficient is selected. Examples of support materials having these properties include borosilicate glass available as Pyrex™ and Tenpax™ and alkaline earth boro-aluminosilicate glass such as Corning™ #1737 and #7059.

To obtain the desired thickness uniformity after grinding of the substrate, the thickness of the support is preferably uniform. For example, for grinding a silicon wafer to 50 μm or less and attaining evenness of ±10% or less, the variability in the thickness of the support should be reduced to ±2 μm or less. In the case where the support is repeatedly used, the support also preferably has scratch resistance. For repeatedly using the support, the wavelength of the radiation energy and the support may be selected to suppress the damage to the support by the radiation energy. For example, when Pyrex glass is used as the support and a third harmonic generation YAG laser (355 nm) is employed, the separation of the support and the substrate can be performed, however, such a support exhibits low transmittance at the wavelength of this laser and absorbs the radiation energy, as a result, the support is thermally damaged and cannot be reused in some cases.

The photothermal conversion layer contains a light absorbing agent and a heat decomposable resin. Radiation energy applied to the photothermal conversion layer in the form of a laser beam or the like is absorbed by the light absorbing agent and converted into heat energy. The heat energy generated abruptly elevates the temperature of the photothermal conversion layer and the temperature reaches the thermal decomposition temperature of the heat decomposable resin (organic component) in the photothermal conversion layer resulting in heat decomposition of the resin. The gas generated by the heat decomposition is believed to form a void layer (such as air space) in the photothermal conversion layer and divide the photothermal conversion layer into two parts, whereby the support and the substrate are separated.

The light-absorbing agent absorbs radiation energy at the wavelength used. The radiation energy is usually a laser beam having a wavelength of 300 to 11,000 nanometers (nm), preferably 300 to 2,000 nm and specific examples thereof include a YAG laser which emits light at a wavelength of 1,064 nm, a second harmonic generation YAG laser at a wavelength of 532 nm, and a semiconductor laser at a wavelength of 780 to 1,300 nm. Although the light absorbing agent varies depending on the wavelength of the laser beam, examples of the light absorbing agent which can be used include carbon black, graphite powder, microparticle metal powders such as iron, aluminum, copper, nickel, cobalt, manganese, chromium, zinc and tellurium, metal oxide powders such as black titanium oxide, and dyes and pigments such as an aromatic diamino-based metal complex, an aliphatic diamine-based metal complex, an aromatic dithiol-base metal complex, a mercaptophenol-based metal complex, a squarylium-based compound, a cyanine-based dye, a methine-based dye, a naphthoquinone-based dye and an anthraquinone-based dye. The light-absorbing agent may be in the form of a film including a vapor deposited metal film. Among these light-absorbing agents, carbon black is particularly useful, because the carbon black significantly decreases the force necessary for separating the substrate from the support after the irradiation and accelerates the separation.

The concentration of the light-absorbing agent in the photothermal conversion layer varies depending on the kind, particle state (structure) and dispersion degree of the light absorbing agent but the concentration is usually from 5 to 70 vol. % in the case of general carbon black having a particle size of approximately from 5 to 500 nm. If the concentration is less than 5 vol. %, heat generation of the photothermal conversion layer may be insufficient for the decomposition of the heat decomposable resin, whereas if it exceeds 70 vol. %, the photothermal conversion layer becomes poor in the film-forming property and may readily cause failure of adhesion to other layers. In the case where the adhesive used as the joining layer is a UV-curable adhesive, if the amount of carbon black is excessively large, the transmittance of the ultraviolet ray for curing the adhesive decreases. Therefore, in the case of using a UV-curable silicone adhesive as the joining layer, the amount of carbon black should be 60 vol. % or less. In order to reduce the force at the time of removing the support after irradiation and thereby prevent abrasion of the photothermal conversion layer during grinding (such as abrasion due to abrasive in wash water), carbon black is preferably contained in the photothermal conversion layer in an amount of 20 to 60 vol. %, more preferably from 35 to 55 vol. %.

Examples of the heat decomposable resin which can be used include gelatin, cellulose, cellulose ester (e.g., cellulose acetate, nitrocellulose), polyphenol, polyvinyl butyral, polyvinyl acetal, polycarbonate, polyurethane, polyester, polyorthoester, polyacetal, polyvinyl alcohol, polyvinylpyrrolidone, a copolymer of vinylidene chloride and acrylonitrile, poly(meth)acrylate, polyvinyl chloride, silicone resin and a block copolymer comprising a polyurethane unit. These resins can be used individually or in combination of two or more thereof. The glass transition temperature (Tg) of the resin is preferably room temperature (20° C.) or more so as to prevent the re-adhesion of the photothermal conversion layer once it is separated due to the formation of a void layer as a result of the thermal decomposition of the heat decomposable resin, and the Tg is more preferably 100° C. or more so as to prevent the re-adhesion. In the case where the light transmitting support is glass, in order to increase the adhesive force between the glass and the photothermal conversion layer, a heat decomposable resin having within the molecule a polar group (e.g., —COOH, —OH) capable of hydrogen-bonding to the silanol group on the glass surface can be used. Furthermore, in applications requiring a chemical solution treatment such as chemical etching, in order to impart chemical resistance to the photothermal conversion layer, a heat decomposable resin having within the molecule a functional group capable of self-crosslinking upon heat treatment, a heat decomposable resin capable of being crosslinked by ultraviolet or visible light, or a precursor thereof (e.g., a mixture of monomers and/or oligomers) may be used. For forming the photothermal conversion layer as an adhesive photothermal conversion layer as shown in FIG. 1(e), an adhesive polymer formed from poly(meth)acrylate or the like, as may be used for the heat decomposable resin, is employed.

The photothermal conversion layer may contain a transparent filler, if desired. The transparent filler acts to prevent the re-adhesion of the photothermal conversion layer once it is separated due to the formation of a void layer as a result of the thermal decomposition of the heat decomposable resin. Therefore, the force required for the separation of the substrate and the support, after grinding of the substrate and subsequent irradiation, can be further reduced. Furthermore, since the re-adhesion can be prevented, the latitude in the selection of the heat decomposable resin is broadened. Examples of the transparent filler include silica, talc and barium sulfate. Use of the transparent filler is particularly advantageous when a UV or visible-curable adhesive is used as the joining layer. Further information regarding the use of transparent fillers may be had with reference to Assignee's published application U.S. 2005/0233547 (Noda et al.), incorporated herein by reference, and WO 2005057651.

The photothermal conversion layer may contain other additives, if desired. For example, in the case of forming the layer by coating a heat decomposable resin in the form of a monomer or an oligomer and thereafter polymerizing or curing the resin, the layer may contain a photo-polymerization initiator. Also, the addition of a coupling agent (integral blend method, i.e., the coupling agent is used as an additive in the formulation rather than as a pre-surface-treatment agent) for increasing the adhesive force between the glass and the photothermal conversion layer, and the addition of a crosslinking agent for improving the chemical resistance are effective for their respective purposes. Furthermore, in order to promote the separation by the decomposition of the photothermal conversion layer, a low-temperature gas generator may be contained. Representative examples of the low-temperature gas generator that can be used include a foaming agent and a sublimating agent. Examples of the foaming agent include sodium hydrogencarbonate, ammonium carbonate, ammonium hydrogencarbonate, zinc carbonate, azodicarbonamide, azobisisobutylonitrile, N,N'-dinitrosopentamethylenetetramine, p-toluenesulfonylhydrazine and p,p-oxybis(benzenesulfonylhydrazide). Examples of the sublimating agent include 2-diazo-5,5-dimethylcyclohexane-1,3-dione, camphor, naphthalene, borneol, butyramide, valeramide, 4-tert-butylphenol, furan-2-carboxylic acid, succinic anhydride, 1-adamantanol and 2-adamantanone.

The photothermal conversion layer can be formed by mixing the light absorbing agent such as carbon black, the heat decomposable resin and a solvent to prepare a precursor coating solution, coating this solution on the support, and drying it. Also, the photothermal conversion layer can be formed by mixing the light absorbing agent, a monomer or an oligomer as a precursor material for the heat decomposable resin and, optionally, additives such as photo-polymerization initiator, and a solvent, if desired, to prepare a precursor coating solution in place of the heat decomposable resin solution, coating the solution on the support, drying and polymerizing/curing it. For the coating, a general coating method suitable for coating on a hard support, such as spin coating, die coating, and roll coating, can be used.

In general, the thickness of the photothermal conversion layer is not limited as long as it permits the separation of the support and the substrate, but it is usually 0.1 µm or more. If the thickness is less than 0.1 µm, the concentration of the light-absorbing agent required for sufficient light absorption becomes high and this deteriorates the film-forming property, and as a result, adhesion to the adjacent layer may fail. On the other hand, if the thickness of the photothermal conversion layer is 5 µm or more while keeping constant the concentration of the light-absorbing agent required to permit the separation by the thermal decomposition of the photothermal conversion layer, the light transmittance of the photothermal conversion layer (or a precursor thereof) becomes low. As a result, when a photo-curable, for example, an ultraviolet (UV)-curable photothermal conversion layer, and a joining layer are used, the curing process is sometimes inhibited to the extent that a sufficiently cured product cannot be obtained. Therefore, in the case where the photothermal conversion layer is, for example, ultraviolet-curable, in order to minimize the force required to separate the substrate from the support after irradiation and to prevent the abrasion of the photothermal conversion layer during grinding, the thickness of the photothermal conversion layer is preferably from about 0.3 to about 3 µm, more preferably from about 0.5 to about 2.0 µm.

Since the substrate to be ground of the laminated body of the present invention can be a wafer having formed thereon a circuit, the wafer circuit may be damaged by radiation energy such as a laser beam reaching the wafer through the light transmitting support, the photothermal conversion layer and the joining layer. To avoid such circuit damage, a light absorbing dye capable of absorbing light at the wavelength of the radiation energy or a light reflecting pigment capable of reflecting the light may be contained in any of the layers constituting the laminated body or may be contained in a layer separately provided between the photothermal conversion layer and the wafer. Examples of light absorbing dyes include dyes having an absorption peak in the vicinity of the wavelength of the laser beam used (for example, phthalocyanine-based dyes and cyanine-based dyes). Examples of light reflecting pigments include inorganic white pigments such as titanium oxide.

The laminated body of the present invention may comprise additional layers other than the substrate to be ground, the joining layer in contact with the substrate to be ground, the photothermal conversion layer and the light transmitting support. Examples of the additional layer include a first intermediate layer (not shown) between the joining layer 3 and the photothermal conversion layer 4, and/or a second intermediate layer (not shown) provided between the photothermal conversion layer 4 and the support 5. The second intermediate layer is preferably joined to the support 5 through a joining layer 3.

In the case where the first intermediate layer is provided, the laminated body 1 is separated at the photothermal conversion layer 4 after the irradiation and a laminated body of first intermediate layer/joining layer 3/substrate 2 is obtained. Therefore, the first intermediate layer acts as a backing during the separation of the joining layer 3 from substrate 2 and enables the easy separation of the two. The first intermediate layer is preferably a multilayer optical film. Also, the first intermediate layer is preferably a film which selectively reflects the radiation energy used to enable the separation, such as YAG laser (near infrared wavelength light). This film is preferred because when the first intermediate layer does not transmit but reflects radiation energy, the radiation energy is prevented from reaching the wafer surface, where circuitry is present, and this eliminates the possibility of damage to the circuitry.

In the case of using a photocurable silicone adhesive as the joining layer 3, a film having a sufficiently high transmittance for curing light such as ultraviolet light is preferred. Accordingly, the multilayer optical film is preferably transmissive to ultraviolet light and selectively reflects near infrared light. The preferred multilayer optical film which is transmissive to ultraviolet light and reflects near infrared light is available as 3M™ Solar Reflecting Film (3M Company, St. Paul, Minn.). The first intermediate layer functions as a substrate for the removal of joining layer 3 from substrate 2 by peeling and therefore, preferably has a thickness of 20 μm or more, more preferably 30 μm or more, and a breaking strength of 20 MPa or more, more preferably 30 MPa or more, still more preferably 50 MPa or more.

In the case where the above-described second intermediate layer is provided, a laminated body of second intermediate layer/joining layer 3/light transmitting support 5 is obtained after the irradiation of the laminated body 1. Therefore, the second intermediate layer acts as a backing during the separation of the joining layer 3 and support 5 and enables the easy separation of the two. As such, by providing a second intermediate layer, the photothermal conversion layer 4 or the joining layer 3 (curable silicone adhesive) is prevented from remaining on the light transmitting support 5, and the support 5 can be easily recycled. In order to enable the removal of joining layer 3 from support 5 by peeling them apart after the laser irradiation and without rupturing, the second intermediate layer preferably has a thickness of 20 μm or more, more preferably 30 μm or more, and a breaking strength of 20 MPa or more, more preferably 30 MPa or more, still more preferably 50 MPa or more. In some cases, the resin of the second intermediate layer permeates into the photothermal conversion layer 4, such as when the second intermediate layer is coated as a mixture of photocurable oligomer and monomer and cured with UV (e.g., when the sheet is produced by coating photothermal conversion layer on the film substrate, coating the second intermediate layer on photothermal conversion layer and curing it, and coating the joining layer on the second intermediate layer). In such cases, in order to prevent re-adhering of the surface separated with a space formed by the laser irradiation, the Tg of the resin (in the case of a photocurable resin, the Tg of the cured resin) may be 40° C. or more.

In the manufacture of the laminated body, it is important to prevent undesirable foreign substances such as air from entering between layers. For example, if air enters between layers, the thickness uniformity of the laminated body is prevented and the substrate to be ground cannot be ground to a thin substrate. In the case of manufacturing a laminated body shown in FIG. 1, the following method, for example, may be considered. First, the precursor coating solution of the photothermal conversion layer is coated on the support by any one of the methods known in the art, dried and cured by irradiating with ultraviolet light or the like. Thereafter, the curable silicone adhesive is coated on either one or both of the surface of the cured photothermal conversion layer and the surface of the substrate in the non-ground side. The photothermal conversion layer and the substrate are attached through the curable silicone adhesive, which is then cured to form the joining layer, for example, by irradiating with ultraviolet light from the support side, whereby a laminated body can be formed. The formation of such a laminated body is preferably performed under vacuum to prevent air from entering between layers. This can be attained by, for example, by modifying a vacuum adhesion device such as that described in Japanese Unexamined Patent Publication (Kokai) No. 11-283279.

The laminated body is preferably designed such that it is free from the invasion of water used during grinding of the substrate, has an adhesive strength between layers so as not to cause dropping off of the substrate, and has an abrasion resistance so as to prevent the photothermal conversion layer from being abraded by the water flow (slurry) containing dusts of the ground substrate.

A thinned substrate can be manufactured by the method comprising preparing a laminated body formed as above, grinding the substrate, to a desired thickness, applying radiation energy to the photothermal conversion layer through the light transmitting support to decompose the photothermal conversion layer and thereby to separate the ground substrate from the light transmitting support, and peeling the joining layer from the substrate.

In one aspect, the method of the present invention is described below by referring to the drawings. In the following, a laser beam is used as the radiation energy source and a silicon wafer is used as the substrate to be ground, however, the present invention is not limited thereto.

Figure 2A:
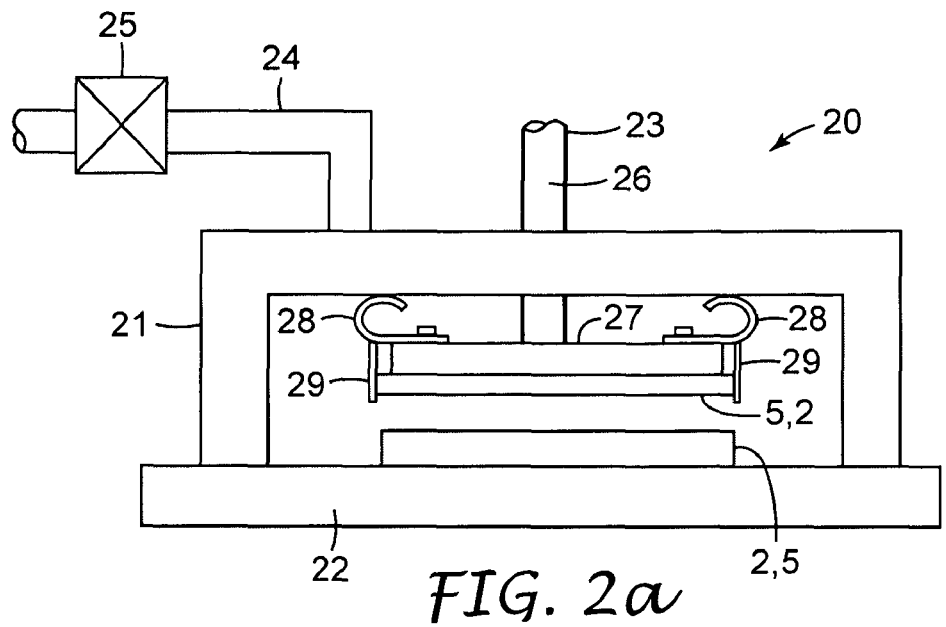
FIG. 2 is a cross-sectional view showing a vacuum adhesion device useful in the present invention.
Figure 2B:
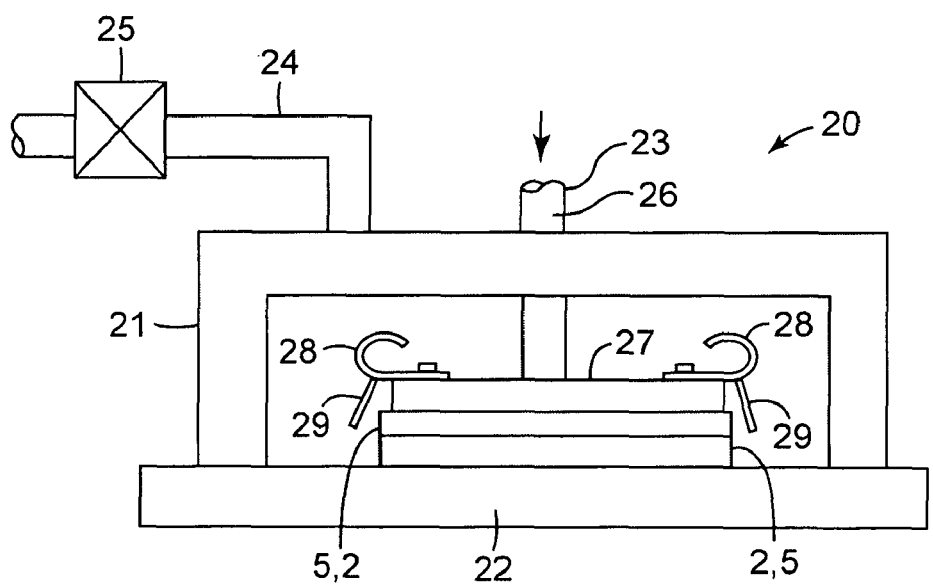

FIG. 2 shows a cross-sectional view of a vacuum adhesion device suitable for the production of the laminated body of one embodiment of the present invention. A vacuum adhesion device 20 comprises a vacuum chamber 21; a supporting part 22 provided in the vacuum chamber 21, on which either one of a substrate 2 to be ground (silicon wafer) or a support 5 is disposed; and holding/releasing means 23 provided in the vacuum chamber 21 and movable in the vertical direction at the upper portion of the supporting part 22, which holds the other one of the support 5 or the silicon wafer 2. The vacuum chamber 21 is connected to a pressure reducing device 25 via pipe 24, so that the pressure inside the vacuum chamber 21 can be reduced. The holding/releasing means 23 has a shaft 26 movable up and down in the vertical direction, a contact surface part 27 provided at the distal end of the shaft 26, leaf springs 28 provided in the periphery of the contact surface part 27, and holding claws 29 extending from each leaf spring 28. As shown in FIG. 2(a), when the leaf springs are in contact with the upper surface of the vacuum chamber 21, the leaf springs are compressed and the holding claws 29 are directed toward the vertical direction to hold the support 5 or the wafer 2 at peripheral edges. On the other hand, as shown in FIG. 2(b), when the shaft 26 is pressed down and the support 5 or the wafer 2 is in close proximity to the wafer 2 or the support 5 respectively disposed on the supporting part, the holding claws 29 are released together with the leaf springs 28 to superimpose the support 5 and the wafer 2.

Using this vacuum adhesion device 20, the laminated body can be manufactured as follows. First, as described above, a photothermal conversion layer is provided on a support 5. Separately, a wafer to be laminated is prepared. On either one or both of the wafer 2 and the photothermal conversion layer of the support 5, an adhesive for forming a joining layer is applied. The thus-prepared support 5 and wafer 2 are disposed in the vacuum chamber 21 of the vacuum adhesion device 20 as shown in FIG. 2(a), the pressure is reduced by the pressure reducing device, the shaft 26 is pressed down to laminate the wafer as shown in FIG. 2(b) and after opening to air, the adhesive is cured, if desired, to obtain a laminated body.

Figure 3:
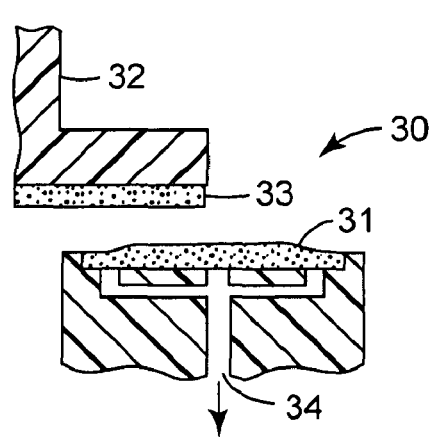
FIG. 3 is a partial cross-sectional view of a grinding device useful in the method of the present invention.
Figure 4A:
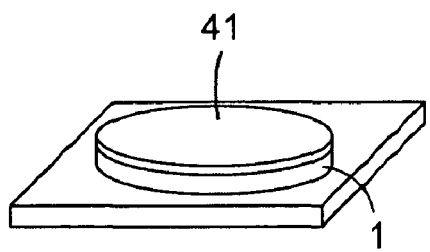
FIG. 4 is a drawing showing the steps of separating the support and peeling the joining layer.
Figure 4A:
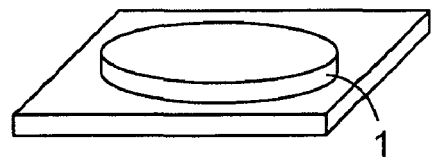
Figure 4B:
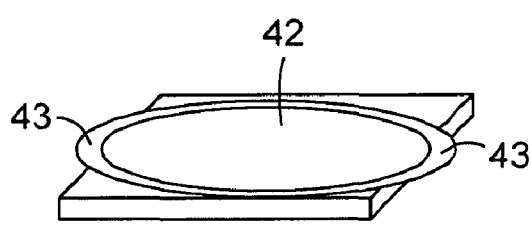
Figure 4C:
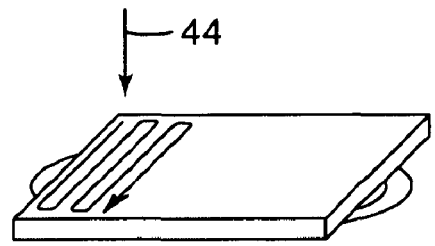
Figure 4D:
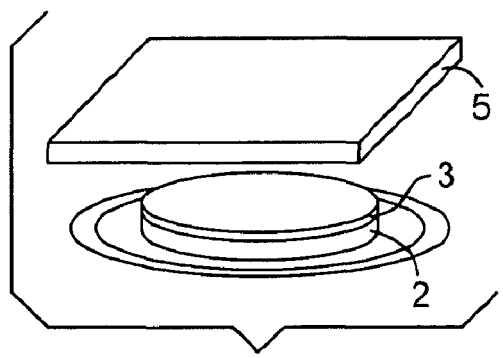
Figure 4E:
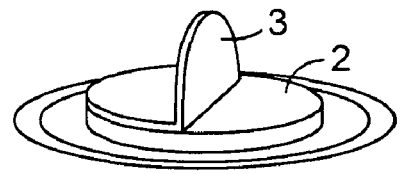

FIG. 3 shows a partial cross-sectional view of a grinding device useful in an embodiment of the invention. The grinding device 30 comprises a pedestal 31 and a grinding wheel 33 rotatably mounted on the bottom end of a spindle 32. A suction port 34 is provided beneath the pedestal 31 and the suction port 34 is connected to a pressure reducing device (not shown), whereby a material to be ground is suctioned and fixed on the pedestal 31 of the grinding device 30. The laminated body 1 of the present invention as shown in FIG. 1 is prepared and used as a material to be ground. The support side of the laminated body 1 is mounted on the pedestal 31 of the grinding device 30 and fixed by suction using a pressure-reducing device. Thereafter, while feeding a fluid flow (such as water or any solution known useful in wafer grinding), the grinding wheel 33 under rotation is brought into contact with the laminated body 1, thereby performing the grinding. The grinding can be performed to a thin level of 150 µm or less, preferably 50 µm or less, more preferably 25 µm or less.

After grinding to the desired level, the laminated body 1 is removed and conveyed to subsequent steps, where the separation of the wafer and the support by irradiation with a laser beam and the peeling of the joining layer from the wafer are performed. FIG. 4 shows a drawing of the steps of separating the support and peeling of the joining layer. First, by taking account of the final step of dicing, a die bonding tape 41 is disposed, if desired, on the ground surface of the wafer side of the laminated body 1 (FIG. 4(*a*)) or the die bonding tape 41 is not disposed (FIG. 4(*a'*)), and thereafter, a dicing tape 42 and a dicing frame 43 are disposed (FIG. 4(*b*)). Subsequently, a laser beam 44 is irradiated from the support side of the laminated body 1 (FIG. 4(*c*)). After the irradiation of the laser beam, the support 5 is picked up to separate the support 5 from the wafer 2 (FIG. 4(*d*)). Finally, the joining layer 3 is separated by peeling to obtain a thinned silicon wafer 2 (FIG. 4(*e*)).

Usually, a semiconductor wafer such as silicon wafer is subjected to chamfering called beveling so as to prevent edges from damage due to impact. That is, the corners at edge parts of a silicon wafer are rounded. When a liquid adhesive is used as the joining layer and coated by spin coating, the joining layer is spread to the edge parts and the adhesive is exposed to edge parts of the grinding surface. As a result, in disposing a dicing tape, not only the ground wafer but also the exposed adhesive come into contact with the pressure-sensitive adhesive of the dicing tape. When the adhesion of the dicing tape used is strong, the joining layer is sometimes difficult to separate. In such a case, it is preferred to previously remove a part of the exposed adhesive before disposing a dicing tape and a dicing frame. For the removal of the exposed adhesive at edge parts, using radiation energy or a $CO_2$ laser (wavelength of 10.6 µm) which the adhesive can sufficiently absorb.

Figure 5:
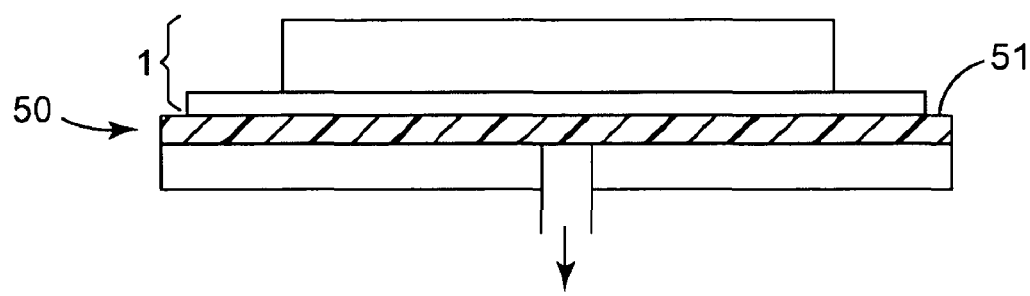
FIG. 5 is a cross-sectional view of a laminated body fixing device which can be used in the laser beam irradiation step.
Figure 6A:
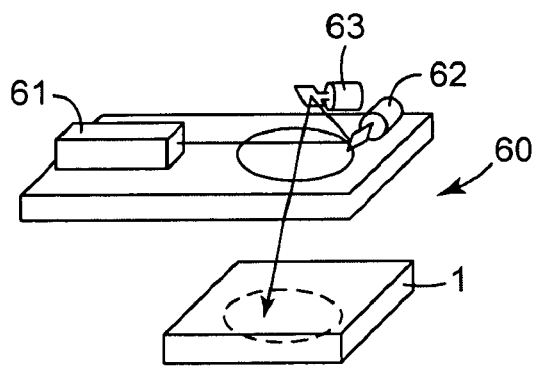
FIG. 6 is a perspective view of a laser irradiation device.
Figure 6B:
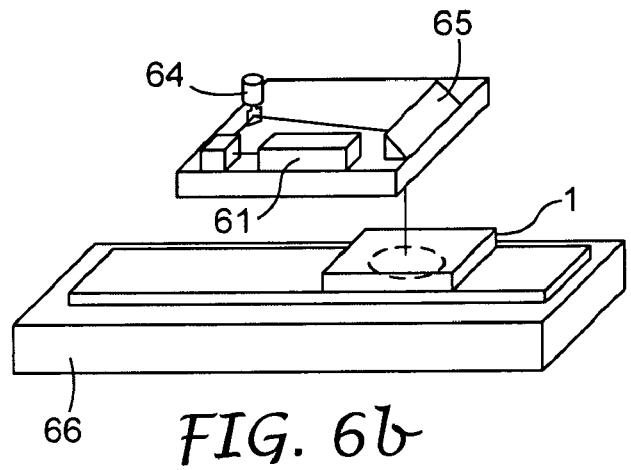
Figure 6C:
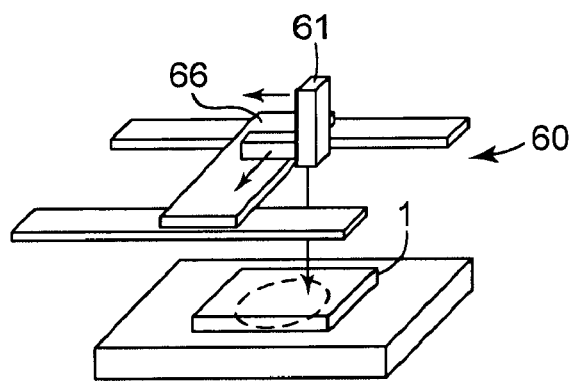
Figure 6D:
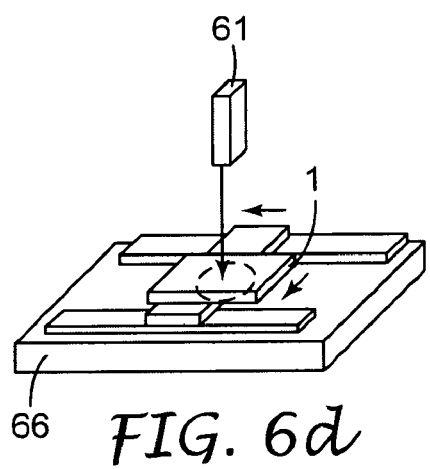
Figure 6E:
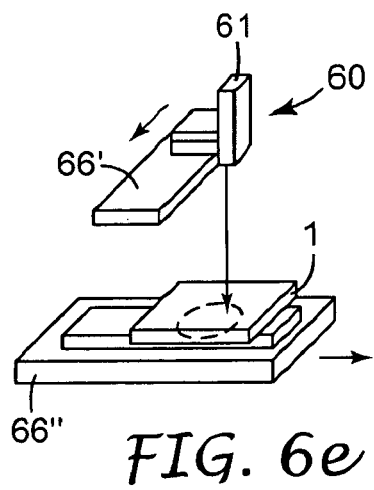
Figure 6F:
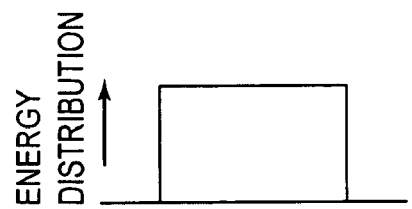

FIG. 5 shows a cross-sectional view of a laminated body fixing device which can be used, for example, in the step of irradiating, such as with a laser beam in one aspect of the invention. The laminated body 1 is mounted on a fixing plate 51 such that the support comes as the upper surface with respect to the fixing device 50. The fixing plate 51 is made of a porous metal such as sintered metal or a metal having surface roughness. The pressure is reduced from the lower part of the fixing plate 51 by a vacuum device (not shown), whereby the laminated body 1 is fixed by suction onto the fixing plate 51. The vacuum suction force is preferably strong enough not to cause dropping in the subsequent steps of separating the support and peeling of the joining layer. A laser beam is used to irradiate the laminated body fixed in this manner. For emitting the laser beam, a laser beam source having an output high enough to cause decomposition of the heat decomposable resin in the photothermal conversion layer at the wavelength of light absorbed by the photothermal conversion layer is selected, so that a decomposition gas can be generated and the support and the wafer can be separated. For example, a YAG laser (wavelength of 1,064 nm), a second harmonic YAG laser (wavelength: 532 nm) and a semiconductor laser (wavelength: from 780 to 1,300 nm) can be used.

As the laser irradiation device, a device capable of scanning a laser beam to form a desired pattern on the irradiated surface and capable of setting the laser output and the beam moving speed is selected. Also, in order to stabilize the processing quality of the irradiated material (laminated body), a device having a large focus depth is selected. The focus depth varies depending on the dimensional precision in the design of device and is not particularly limited but the focus depth is preferably 30 µm or more. FIG. 6 shows a perspective view of a laser irradiation device which can be used in the present invention. The laser irradiation device 60 of FIG. 6(*a*) is equipped with a galvanometer having a biaxial configuration composed of the X axis and the Y axis and is designed such that a laser beam oscillated from a laser oscillator 61 is reflected by the Y axis galvanometer 62, further reflected by the X axis galvanometer 63 and irradiated on the laminated body 1 on the fixing plate. The irradiation position is determined by the directions of the galvanometers 62 and 63. The laser irradiation device 60 of FIG. 6(*b*) is equipped with a uniaxial galvanometer or a polygon mirror 64 and a stage 66 movable in the direction orthogonal to the scanning direction. A laser beam from the laser oscillator 61 is reflected by the galvanometer or polygon 64, further reflected by a hold mirror 65 and irradiated on the laminated body 1 on the movable stage 66. The irradiation position is determined by the direction of the galvanometer or polygon 64 and the position of the movable stage 66. In the device of FIG. 6(*c*), a laser oscillator 61 is mounted on a movable stage 66 which moves in the biaxial direction of X and Y, and a laser is irradiated on the entire surface of the laminated body 1. The device of FIG. 6(*d*) comprises a fixed laser oscillator 61 and a movable stage 66 which moves in the biaxial direction of X and Y. The device of FIG. 6(*e*) has a constitution such that a laser oscillator 61 is mounted on a movable stage 66' which can move in the uniaxial direction and a laminated body 1 is mounted on a movable stage 66" which can move in the direction orthogonal to the movable stage 66'.

When there is concern about damaging the wafer of the laminated body 1 by the laser irradiation, a top hat form (see FIG. 6(*f*)) having a steep energy distribution and very reduced leakage energy to the adjacent region is preferably formed. The beam form may be changed by any known method, for example, by (a) a method of deflecting the beam by an acousto-optic device, a method of forming a beam using refraction/diffraction, or (b) a method of cutting the broadening portion at both edges by using an aperture or a slit.

The laser irradiation energy is determined by the laser power, the beam scanning speed and the beam diameter. For example, the laser power that can be used is, but not limited to, from 0.3 to 100 watts (W), the scanning speed is from 0.1 to 40 meters/second (m/s), and the beam diameter is from 5 to 300 µm or more. In order to increase the speed of this step, the laser power is enhanced and thereby the scanning speed is increased. Since the number of scans can be further reduced as the beam diameter becomes larger, the beam diameter may be increased when the laser power is sufficiently high.

The heat decomposable resin in the photothermal conversion layer is decomposed by the laser irradiation to generate a gas that creates cracks inside the layer to separate the photothermal conversion layer itself. If air enters in between the cracks, re-adhesion of the cracks can be prevented. Therefore, in order to facilitate the entering of air, it is desirable to perform the beam scanning from the edge part of the laminated body to the interior of the laminated body.

As described above, the glass transition temperature (Tg) of the photothermal conversion layer is preferably room temperature (20° C.) or more. This is because the separated cracks may re-adhere to one another during the cooling of the decomposed resin and make the separation impossible. The re-adhesion is considered to occur due to the fact that the cracks of the photothermal conversion layer become attached with each other under the weight of the support. Therefore, the re-adhesion can be prevented when the irradiation process is contrived not to impose the weight of the support, for example, by performing the laser irradiation in the vertical direction from the lower part to the upper part (namely, by performing the laser irradiation in a configuration such that the support comes to the bottom side) or by inserting a hook between the wafer and the photothermal conversion layer from the edge part and lifting the layer.

To employ a laser beam from the edge part of the laminated body, a method of applying the laser beam while linearly reciprocating it from the edge part to the tangential direction of wafer or, alternatively, a method of spirally irradiating the laser beam from the edge part to the center like a phonograph record may be used.

Figure 7A:
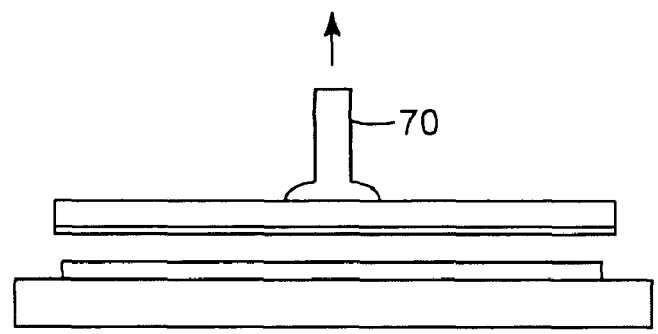
FIG. 7 is a schematic view of a pick-up used in the operation of separating wafer and support.
Figure 7B:
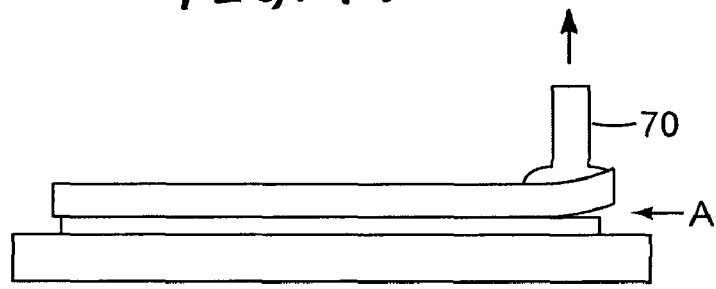

After the laser irradiation, the support is separated from the wafer and for this operation a general pick-up using a vacuum is used. The pick-up is a cylindrical member connected to a vacuum device having a suction device at the distal end. FIG. 7 shows a schematic view of a pick-up for use in the separation operation of the wafer and the support. In the case of FIG. 7(a), the pick-up 70 is in the center of the support 5 and picked up in the vertical direction, thereby peeling off the support. Also, as shown in FIG. 7(b), the pick-up 70 is at the edge part of the support 5 and by peeling while blowing a compressed air (A) from the side to enter air between the wafer 2 and the support 5, the support can be more easily peeled off.

Figure 8:
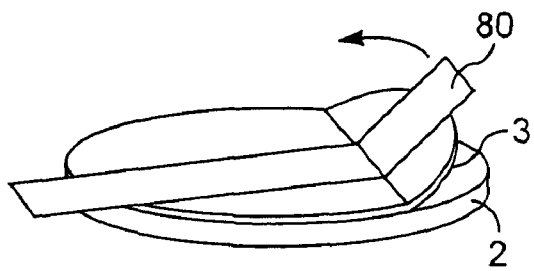
FIG. 8 is a schematic view showing how the joining layer is peeled from the wafer.
Figure 9:
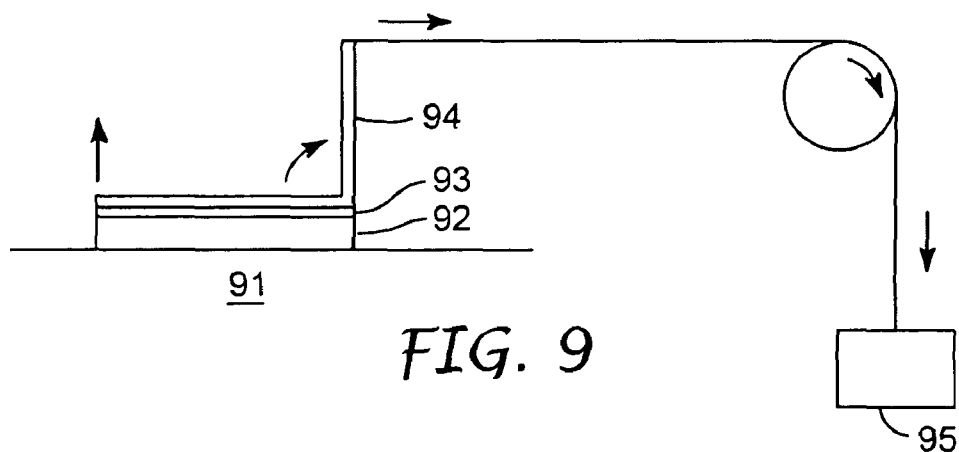
FIG. 9 is a schematic view of an apparatus for measuring the adhesive strength of the joining layer.

After removing the support, the joining layer on the wafer is removed. FIG. 8 is a schematic view showing how the joining layer is peeled. For the removal of the joining layer 3, preferably, an adhesive tape 80 for removing the joining layer, which can create a stronger adhesive bond with joining layer 3 than the adhesive bond between the wafer 2 and the joining layer 3, can be used. Such an adhesive tape 80 is placed to adhere onto the joining layer 3 and then peeled in the arrow direction, whereby the joining layer 3 is removed.

Finally, a thinned wafer remains in the state of being fixed to a dicing tape or a die frame with or without a die bonding tape. This wafer is diced in a usual manner, thereby completing a chip. However, the dicing may be performed before the laser irradiation. In such a case, it is also possible to perform the dicing step while leaving the wafer attached to the support, then subject only the diced region to the laser irradiation and separate the support only in the diced portion. The present invention may also be applied separately to a dicing step without using a dicing tape, by retransferring through a joining layer the ground wafer onto a light transmitting support having provided thereon a photothermal conversion layer.

The present invention is effective, for example, in the following applications.

1. Laminated CSP (Chip Size Package) for High-Density Packaging

The present invention is useful, for example, with a device form called system-in-package where a plurality of Large Scale Integrated (LSI) devices and passive parts are housed in a single package to realize multifunction or high performance, and is called a stacked multi-chip package. According to the present invention, a wafer of 25 μm or less can be reliably manufactured in a high yield for these devices.

2. Through-Type CSP Requiring High Function and High-Speed Processing

In this device, the chips are connected by a through electrode, whereby the wiring length is shortened and the electrical properties are improved. To solve technical problems, such as formation of a through hole for forming a through electrode and embedding of copper in the through hole, the chip may be further reduced in the thickness. In the case of sequentially forming chips having such a configuration by using the laminated body of the present invention, an insulating film and a bump (electrode) may be formed on the back surface of the wafer and the laminated body needs resistance against heat and chemicals. Even in this case, when the above-described support, photothermal conversion layer and joining layer are selected, the present invention can be effectively applied.

3. Thin Compound Semiconductor (e.g., GaAs) Improved in Heat Radiation Efficiency, Electrical Properties, and Stability Compound semiconductors such as gallium arsenide are being used for high-performance discrete chips, laser diode and the like because of their advantageous electrical properties (high electron mobility, direct transition-type band structure) over silicon. Using the laminated body of the present invention and thereby reducing the thickness of the chip increases the heat dissipation efficiency thereof and improves performance. At present, the grinding operation for thickness reduction and the formation of an electrode are performed by joining a semiconductor wafer to a glass substrate as the support using a grease or a resist material. Therefore, the joining material may be dissolved by a solvent for separating the wafer from the glass substrate after the completion of processing. This is accompanied with problems that the separation requires more than several days time and the waste solution should be treated. These problems can be solved when the laminated body of the present invention is used.

4. Application to Large Wafer for Improving Productivity

In the case of a large wafer (for example, a 12 inch-diameter silicon wafer), it is very important to separate the wafer and the support easily. The separation can be easily performed when the laminated body of the present invention is used, and therefore, the present invention can be applied also to this field.

5. Thin Rock Crystal Wafer

In the field of rock crystal wafer, the thickness reduction of a wafer is required to increase the oscillation frequency. The separation can be easily performed when the laminated body of the present invention is used, and therefore, the present invention can be applied also to this field.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted.

| Table of Abbreviations | |
|---|---|
| Abbreviation or Trade Designation | Description |
| VQM-135 | Mixture of vinyl-terminated polydimethylsiloxane with about 20-25% by weight vinyl-functional silicate resin commercially available from Gelest, Morrisville, PA. |
| DMS-V31 | Vinyl-terminated polydimethylsiloxane commercially available from Gelest, Morrisville, PA. |

-continued

Table of Abbreviations

| Abbreviation or Trade Designation | Description |
|---|---|
| VQX-221 | Vinyl-modified Q silica resin 50% solution in xylenes commercially available from Gelest, Morrisville, PA. |
| SYL-OFF 7678 | Silane-functional polydimethylsiloxane commercially available from Dow Corning, Midland, MI. |
| Catalyst | ($\eta^5$-methylcyclopentadienyl)trimethylplatinum(IV) (MeCpPtMe$_3$) commercially available from Alfa Aesar, Ward Hill, MA. |
| LTHC glass | A glass plate of 1 millimeter thickness that has an LTHC (light-to-heat-conversion) coating on it. |

Example 1

A mixture of 100.0 grams of VQM-135, 7.2 grams of SYL-Off 7678, and 4.4 milligrams of Catalyst was prepared in an amber bottle. Using a notch bar coater, a 75 micrometer thick layer of this adhesive composition was coated onto the polyimide passivation layer of a silicon wafer. A piece of LTHC glass was placed on the adhesive with the LTHC layer facing the wafer. This sandwich was passed under a UV processor (Fusion D bulb, low power, exposure time approximately 15 seconds). The UV illumination passed through the glass and cured the adhesive. Upon prying the glass off of the wafer, the adhesive layer remained adhered to the glass and removed cleanly from the polyimide surface.

Example 2

A mixture of 56.0 grams of VQM-135, 42.0 grams of DMS-V31 and 140.0 grams of VQX-221 was prepared in a glass bottle. The xylenes solvent was removed using a rotary evaporator attached to a vacuum pump. To the resulting mixture was added 17.5 grams of SYL-Off 7678, and 7.7 milligrams of Catalyst. Using a notch bar coater, a 75-micrometer thick layer of this adhesive composition was coated onto the polyimide passivation layer of a silicon wafer. A piece of LTHC glass was placed on the adhesive with the LTHC layer facing the wafer. This sandwich was passed under a UV processor (Fusion D bulb, low power, exposure time approximately 15 seconds). The UV illumination passed through the glass and cured the adhesive. Upon prying the glass off of the wafer, the adhesive layer remained adhered to the glass and removed cleanly from the polyimide surface.

What is claimed is:

1. A method of providing a thin substrate comprising:
   providing a laminated body comprising
      a substrate to be ground;
      a joining layer comprising a cured silicone in contact with said substrate;
      a photothermal conversion layer comprising a light absorbing agent and a heat decomposable resin disposed beneath the joining layer; and
      a light transmitting support disposed beneath the photothermal conversion layer;
   subjecting the laminated body to temperatures in excess of 200° C.;
   grinding the face of said substrate to a desired thickness to form a ground semiconductor wafer;
   irradiating radiation energy through said light-transmitting support side to decompose said photothermal conversion layer, thereby causing separation into a thin substrate having said joining layer and a light-transmitting support; and optionally
   removing said cured silicone joining layer from said ground substrate.

2. A method according to claim 1, wherein providing a laminated body comprises:
   applying a photothermal conversion layer comprising a light-absorbing agent and a heat decomposable resin on a light-transmitting support;
   preparing a semiconductor wafer having a circuit face with a circuit pattern and a non-circuit face on the side opposite of said circuit face;
   laminating said semiconductor wafer and said light-transmitting support through a curable silicone adhesive by placing said circuit face and said photothermal conversion layer to face each other; and
   irradiating light through said light-transmitting support side to cure the curable silicone adhesive layer, thereby forming a laminated body having a non-circuit face on the outside surface.

3. A method according to claim 2, wherein laminating said semiconductor wafer and said light-transmitting support through a curable silicone adhesive is performed in a vacuum.

4. A method according to claim 1, wherein the ground semiconductor wafer is ground to a thickness of 50 μm or less.

5. A method according to claim 1, wherein the ground semiconductor wafer has been partially sawn through on the circuit face.

6. A method according to claim 1, further comprising dicing the ground semiconductor wafer to cut it into a plurality of ground semiconductor chips.

7. A method according to claim 6, wherein a die bonding tape is affixed to the semiconductor wafer before dicing the ground semiconductor wafer.

8. A method according to claim 2, wherein the ground semiconductor wafer is ground to a thickness of 50 μm or less.

9. A method according to claim 2, wherein the ground semiconductor wafer has been partially sawn through on the circuit face.

10. A method according to claim 2, further comprising dicing the ground semiconductor wafer to cut it into a plurality of ground semiconductor chips.

11. A method according to claim 10, wherein a die bonding tape is affixed to the semiconductor wafer before dicing the ground semiconductor wafer.

12. A method according to claim 1, wherein the substrate to be ground comprises a semiconductor wafer, said wafer having a circuit face adjacent said joining layer and a non-circuit face.

13. A method according to claim 2, wherein the substrate to be ground comprises a semiconductor wafer, said wafer having a circuit face adjacent said joining layer and a non-circuit face.

14. A method according to claim 1, wherein subjecting the laminated body to temperatures in excess of 200° C. comprises subjecting the laminated body to temperatures in excess of 250° C.

15. A method according to claim 2 further comprising removing said cured silicone joining layer from said ground substrate.

16. A method according to claim 15, further comprising subjecting the semiconductor wafer to sputtering, dry etching, or a combination thereof.

* * * * *